United States Patent [19]
Niijima

[11] Patent Number: 5,479,118
[45] Date of Patent: Dec. 26, 1995

[54] PULSE WIDTH DISCRIMINATING CIRCUIT

[75] Inventor: Shinji Niijima, Tokyo, Japan

[73] Assignee: NEC Corporation, Tokyo, Japan

[21] Appl. No.: 355,301

[22] Filed: Dec. 12, 1994

[51] Int. Cl.$^6$ .................................................. H03K 5/26
[52] U.S. Cl. .................. 327/38; 327/37; 377/39
[58] Field of Search .................. 327/37, 38; 377/39, 377/49

[56] References Cited

U.S. PATENT DOCUMENTS

| | | | |
|---|---|---|---|
| 3,980,960 | 9/1976 | Hutchinson | 327/38 |
| 4,870,665 | 9/1989 | Vaughn | 377/39 |
| 5,223,742 | 6/1993 | Schumacher | 377/39 |

Primary Examiner—John S. Heyman
Attorney, Agent, or Firm—Foley & Lardner

[57] ABSTRACT

A pulse width discriminating circuit comprises an edge detecting circuit receiving an input signal for generating a detection signal when the input signal rises up, first to third counters each cleared by the detection signal and counting a different count clock, a capture register responding to the detection signal to store a count value of the first counter, an arithmetic operation circuit for multiplying the stored value in the capture register with a predetermined constant number, and a compare register storing the result of the multiplication operation performed in the arithmetic operation circuit. First to third comparators are provided each comparing the stored value of the compare register with a count value of a corresponding one counter of the first to third counters for generating a coincidence signal, and each of a plurality of latch circuits responds to the coincidence signal of a corresponding comparator of the first to third comparators to latch a level of the input signal.

4 Claims, 9 Drawing Sheets

FIGURE 6

| 31.5%POINT $\begin{pmatrix}\text{LATCHED}\\\text{DATA 32}\end{pmatrix}$ | 45%POINT $\begin{pmatrix}\text{LATCHED}\\\text{DATA 12}\end{pmatrix}$ | 63%POINT $\begin{pmatrix}\text{LATCHED}\\\text{DATA 22}\end{pmatrix}$ | RESULT OF DISCRIMINATION |
|---|---|---|---|
| L | L | L | A - I |
| H | L | L | A - II |
| H | H | L | B - I |
| H | H | H | B - II |

5,479,118

PULSE WIDTH DISCRIMINATING CIRCUIT

BACKGROUND OF THE INVENTION

1. Field of the Invention

The present invention relates to a pulse width discriminating circuit, and more specifically to a pulse width discriminating circuit capable of decoding an input signal which has a variable period and which has been pulse-modulated.

2. Description of Related Art

Referring to FIG. 1, there is shown a block diagram of a conventional pulse width discriminating circuit.

The pulse width discriminating circuit shown in FIG. 1 includes an input terminal 7 receiving an external signal, an edge detecting circuit 5 receiving an input signal 13 supplied from the input terminal 7 and for outputting an edge detecting signal 14 when a rising edge of the input signal 13 is detected, and a counter 1 initialized by the edge detection signal 14 and for counting up a count clock f 8. The shown pulse width discriminating circuit also includes a capture register (called a "CPT register" hereinafter) 2 for storing a count value 9 of the counter 2 in response to the edge detecting signal 14, a compare register (called a "CRO register" hereinafter) 3 for designating a tinting where a level of the input signal 13 should be detected, a comparator 4 for comparing the count value 9 of the counter 1 with a stored value 10 of the CRO register 3 and for generating a coincidence signal 11 when the count value 9 of the counter 1 becomes coincident with a stored value 10 of the CRO register 3, and a latch 6 responding to the coincidence signal 11 to latch the level of the input signal 13 and to output the latched level as a latched data 12. Furthermore, the shown pulse width discriminating circuit includes an arithmetic operation circuit 100 configured to receive a stored value 101 in the CPT register 2 and to multiply the received stored value 101 by a value of a constant number register 111 so as to output the result of multiplication as a CRO setting value 102 to the ere register 3.

Now, operation of the pulse width discriminating circuit shown in FIG. 1 will be explained.

First, a pulse width discrimination will be described on the case of decoding a pulse that has a variable period and that has been pulse modulated. The fact that the pulse has been pulse modulated, means that the input pulse has two different duty ratios. In the conventional example, it is assumed that, the input pulse assumes either a pulse form A-I (duty ratio of 30%) shown in FIG. 2 or a pulse form B-I (duty ratio of 60%) shown in FIG. 2.

For pulse width discrimination, whether the input pulse is the pulse form A-I or B-I can be discriminated by detecting the level of the input pulse during a period in which the pulse forms A-I and B-I take different levels from each other. In other words, the level of the input pulse is detected at any time point during a period of 30% to 60% of each period of the input pulse. If the detected level is a low level, it is discriminated that the input signal is the pulse form A-I, and if the detected level is a high level, it is discriminated that the input signal is the pulse form B-I. In the conventional example, the level of the input pulse is detected at a time point of 45%, which is an intermediate time point between a time point of 30% and a time point of 60%.

Now, this operation will be described with reference to FIG. 1 and FIG. 3 which is a timing chart illustrating an operation of the conventional pulse width discriminating circuit receiving the input signal composed of two pulse forms having different duty ratios.

When a pulse is applied to the input terminal 7 and the input signal 13 changes from the low level to the high level, the edge detecting circuit 13 outputs the edge detection signal 14. In response to this edge detection signal 14, the count value 9 of the counter 1 having counted up in response to the count clock f 8 is stored in the CPT register 2, and the counter 1 is cleared. The value (nl) stored in the CPT register 2 indicates one period of the input signal 13, and a time point of 45% in one period is set by using the value (n1) stored in the CPT register 2.

First, the arithmetic operation circuit fetches the value 101 stored in the CPT register 2, and multiplies the stored value 101 by the value of the constant number register I 11. In this case, 0.45 is previously set in the constant number register 111. The result of the multiplication is stored in the CRO register 3 as the CRO setting value 102. Thus, the value corresponding to 45% of one period is set in the CRO register 3.

On the other hand, the count clock f 8 is counted in the cleared counter I in a next period, and when the count value 9 becomes coincident with the CRO stored value 10, the comparator 4 outputs the coincidence signal 11, so that the latch circuit 6 latches the level of the input signal 13. Thus, the latch circuit 6 latches the level at the time point of 45% of one period of the input signal 13. Namely, the latched data 12 indicates the level at the time point of 45% of one period of the input signal 13. If the latched data is at a low level, the latched input signal is in the pulse form A-I, and if the latched data is at a high level, the latched input signal is in the pulse form B-I.

Incidentally, if the period of the input pulse is at a constant, the value set in the CRO register 3 my be fixed. However, if the period of the input pulse is variable, it is necessary to rewrite the CRO register 3 when the period of the input pulse varies. The conventional example is such that the period of the input pulse received before one period is measured, so as to estimate or approximate the period of the input pulse currently received.

Next, the pulse width discrimination will be described on the case of decoding the input signal that has been double pulse-modulated.

In this case, the input pulse assumes four pulse forms A-I, A-II, B-I, B-II shown in FIG. 2. The fact that the input signal has been double pulse-modulated, means that the pulse of one period indicates two bits of dam. In other words, a pulse indicative of data A is modulated by data I or date II. Specifically, if the pulse indicative of dam A is modulated by data I, the duty ratio of the dam A is maintained as it is, and if the pulse indicative of data A is modulated by data II, the duty ratio of the data A is changed to increase by 5%. In addition, a pulse indicative of data B is modulated by data I or date II. Specifically, if the pulse indicative of data B is modulated by data I, the duty ratio of the data B is maintained as it is, and if the pulse indicative of data B is modulated by data II, the duty milo of the data B is changed to increase by 5%.

In order to discriminate the pulse as mentioned above, it is sufficient if the level is detected at a time point X between 30% and 35% of one pulse period, at a time point Y between 35% and 60% of one pulse period, and at a time point Z between 60% and 65% of one pulse period. For example, if the level on the time point X is at a high level and the level on the time points Y and Z is at the low level, the pulse received at this time means the data A and the data II.

In operation, the rising edge of the input signal 13 is detected in the edge detecting circuit 5, and the count 9 (n1) is stored in the CPT register 2. Thereafter, the arithmetic operation circuit 100 performs a multiplication expressed by the following equation (1), and the result of the multiplication is stored in the CRO register 3 for level detection at the time point X. After the level detection at the time point X has been completed, the value of the constant number register 111 is rewritten to a value Y. Furthermore, the arithmetic operation circuit 100 performs a second multiplication expressed by the following equation (2) and the result of the multiplication is stored in the CRO register 3 for level detection at the time point Y. After the level detection at the time point Y has been completed, the value of the constant number register 111 is rewritten to a value Z. Furthermore, the arithmetic operation circuit 100 performs a third multiplication expressed by the following equation (3) and the result of the multiplication is stored in the CRO register 3 for level detection at the time point Z. Thus, the input pulse width discrimination is performed on the basis of the levels detected at the three different time points.

$$\{CPR \text{ stored value } 101 \text{ } (n1)\} \times X \quad (1)$$

$$\{CPR \text{ stored value } 101 \text{ } (n1)\} \times Y \quad (2)$$

$$\{CPR \text{ stored value } 101 \text{ } (n1)\} \times Z \quad (3)$$

Accordingly, the level detection is performed three times in each one period of the pulse.

As seen from the above, in the case of decoding the double-pulse-modulated signal the conventional pulse width discrimination circuit has to perform the multiplication operation a plurality of times. However, in a time required for a series processing for setting the CRO register 3, the proportion of time for the multiplication operation is greatly high and reaches about 50%. Accordingly, the plurality of multiplication operations increase a lead for the arithmetic operation circuit 10. In ordinary cases, the arithmetic operation circuit 10 is rarely provided exclusively for the pulse width discrimination circuit, and actually, the arithmetic operation circuit 10 is used not only for the pulse width discrimination but also for other various arithmetic operations (for example, as in a CPU of a microcomputer internally containing the pulse width discrimination circuit). In this case, the increase of the lead on the arithmetic operation circuit 10 results in a drop of the overall processing efficiency of the system.

In addition, since the rewriting of the set value of the CRO register 3 must be performed after the level detection at a detection time point has been completed, if a substantial time is entailed to set a value in the CRO register 3, when the pulse period becomes short, there is a fear that the setting of the CRO register becomes out of time. For example, it may be expected that, after the level detection on the time point X has been completed, the time point Y of the pulse passes before the equation (2) is executed to set the result of the multiplication to the CRO register 3. In this situation, a correct pulse width discrimination cannot be performed. Furthermore, if a substantial time is entailed to set a value in the CRO register 3, it becomes impossible to normally perform the pulse width discrimination in the case that a difference in duty ratio of input pulses is small.

For example, an index search of a VTR (video tape recorder) is performed to discriminate a duty ratio of a CTL signal stored in a longitudinal direction of a tape. In a search mode, pulse of the number near to about 6000 are inputted per one second. Therefore, if the level detection is performed three times for each one period Of pulse, the level detection must be performed 18,000 times per one second.

Here, considering the above mentioned pulse width discrimination in which the first level detection is performed at a time point of 30% of one pulse period and the second level detection is performed at a time point of 45% of one pulse period, since one pulse period is about 167 μs, the value of the CRO register 3 must be rewritten during a time of 15% of one pulse period, namely, during a time length of 25 μs. Since the time required for the rewriting is on the order of about 10 μs, it is too small in margin.

In addition to this too small margin, since the arithmetic operation circuit 10 is not provided exclusively for the pulse width discrimination circuit, the generation of the set value for the CRO register 3 is left in a waiting condition when another processing is under execution.

As seen from the above, it is very difficult to rewrite the CRO register three times per one pulse period, in a time before the respective level detections, and there is a fear of a malfunction.

SUMMARY OF THE INVENTION

Accordingly, it is an object of the present invention to provide a pulse width discriminating circuit which has overcome the above mentioned defect of the conventional one.

Another object of the present invention is to provide a pulse width discriminating circuit capable of properly discriminating the pulse width even when the pulse period becomes short and even when the difference in duty ratio is small, with a reduced number of multiplications operations for setting a value to a register designating the level detecting time point.

The above and other objects of the present invention are achieved in accordance with the present invention by providing a plurality of counters or compare registers in a pulse width discriminating circuit, so that the pulse width discrimination can be executed without rewriting a stored value of the compare register during one pulse period.

In other words, when the a plurality of counters are provided, these counters count different count clocks, respectively, and count values of these counters are compared with a stored value of a compare register. In this case, even if it is necessary to perform the level detection at a plurality of detection time points, it becomes unnecessary to rewrite the stored in the compare register during one pulse period.

If a plurality of compare registers are provided, the arithmetic operation is performed the times corresponding to the number of the compare registers, and a count value of the counter is compared with the stored values of these compare registers. In this case, it also becomes unnecessary to rewrite the stored in the compare register during one pulse period.

The above and other objects, features and advantages of the present invention will be apparent from the following description of preferred embodiments of the invention with reference to the accompanying drawings.

BRIEF DESCRIPTION OF THE DRAWINGS

FIG. 6 is a table showing the relation between the latched data and the result of the discrimination in the first embodiment of the pulse width discriminating circuit shown in FIG. 4;

DESCRIPTION OF THE PREFERRED EMBODIMENTS

Figure 2:
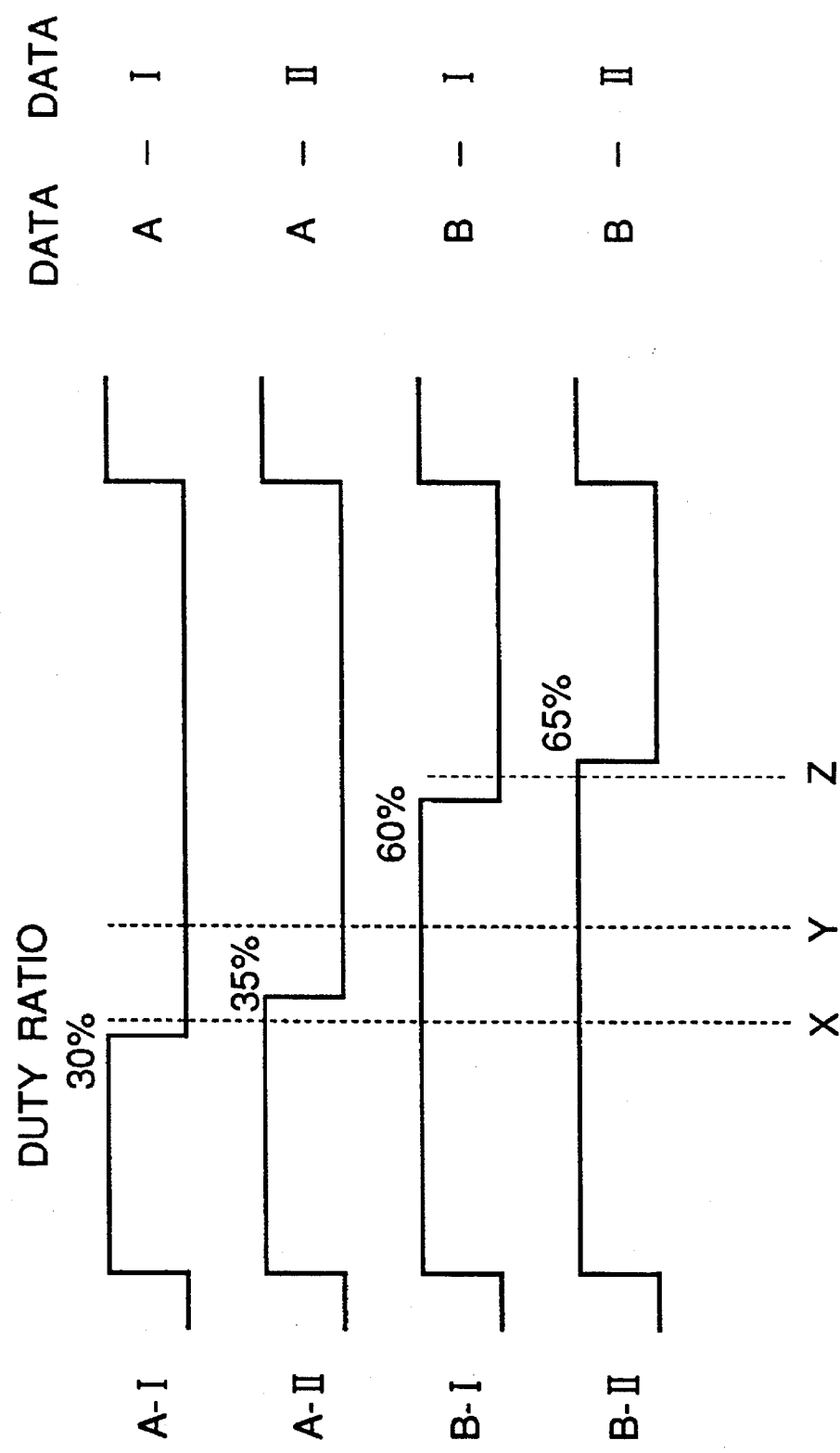
FIG. 2 illustrates four different pulse-modulated pulse forms.
Figure 3:
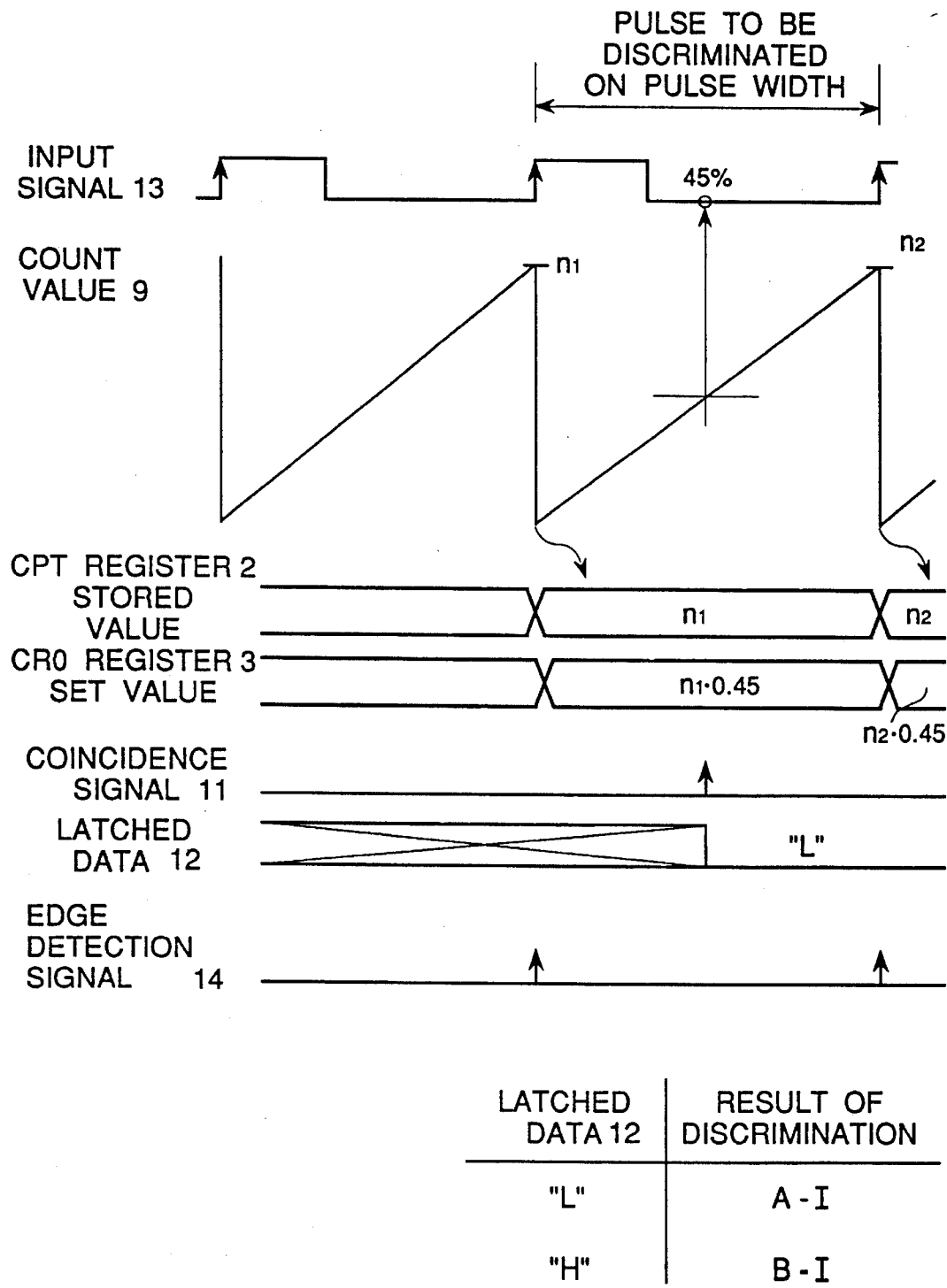
FIG. 3 is a timing chart illustrating an operation of the conventional pulse width discriminating circuit receiving the input signal composed of two pulse forms having different duty ratios.

The pulse width discriminating circuit in accordance with the present invention is different from the conventional pulse width discriminating circuit in that a plurality of timers counting up in response to different count clocks, respectively, am provided, and also, a plurality of registers for designating a level detecting time point are provided each for one of the timers, so that each of two kinds of data included in the double-pulse-modulated pulse signal is pulse-width-discriminated by separate circuits, respectively. In other words, in the pulse data shown in FIG. 2, the discrimination on whether the input pulse includes the data A or the data B is made independently of the discrimination on whether the input pulse includes the data I or the data II.

Figure 1:
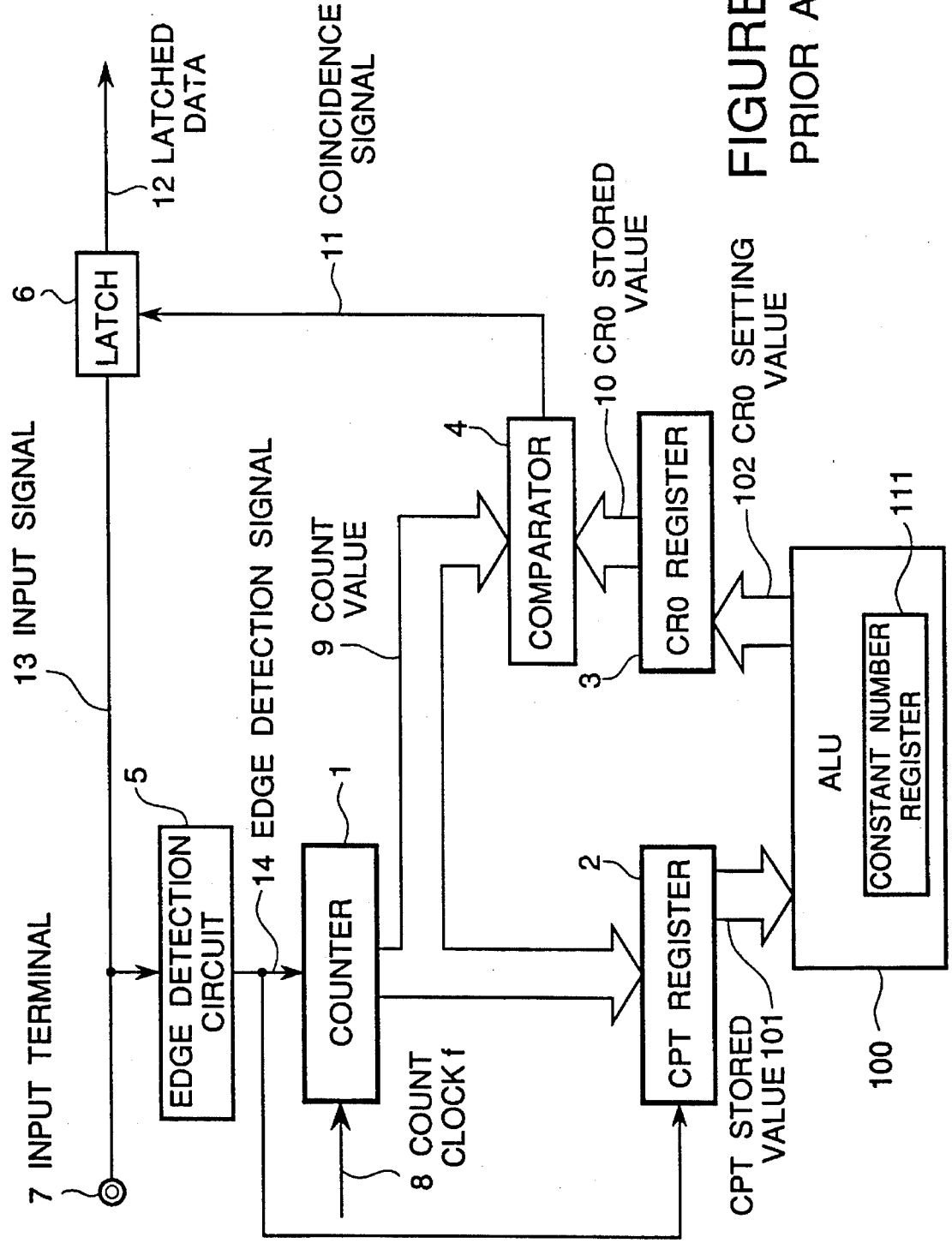
FIG. 1 is a block diagram of a conventional pulse width discriminating circuit.
Figure 4:
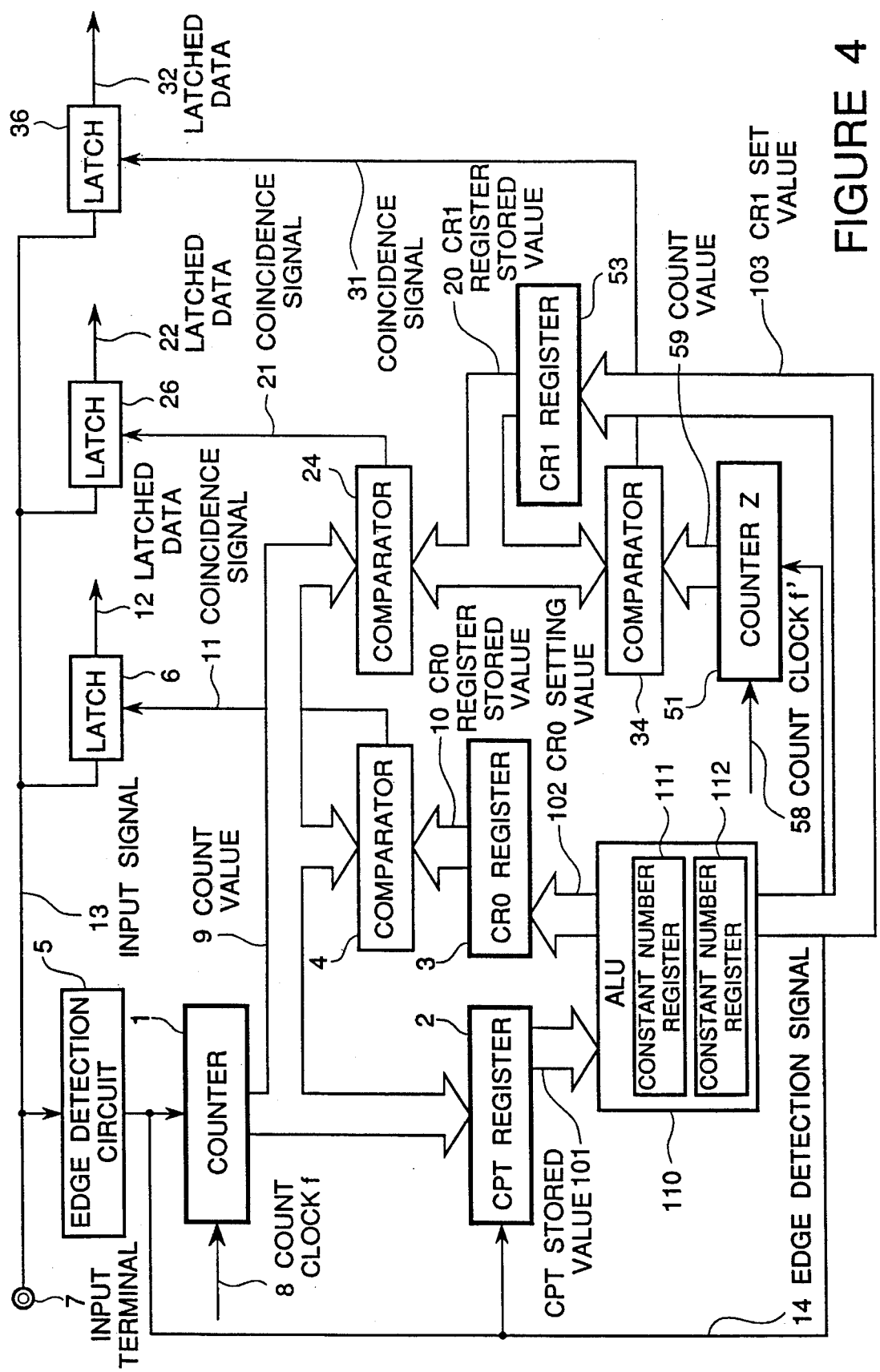
FIG. 4 is a block diagram of a first embodiment of the pulse width discriminating circuit in accordance with the present invention.

Referring to FIG. 4, there is shown a block diagram of a first embodiment of the pulse width discriminating circuit in accordance with the present invention. In FIG. 4, elements similar to those shown in FIG. 1 are given the same Reference Numerals, and explanation thereof will be omitted.

As seen from comparison between FIGS. 1 and 4, the first embodiment is characterized in that in addition to the construction shown in FIG. 1, there are provided a counter Z 51, a compare register 53 (called a "CR1 register" hereinafter), comparators 24 and 34, latch circuits 26 and 36, and an arithmetic operation circuit 110 constituted by adding a constant number register 112 to the constant number register 111 of the arithmetic operation circuit 100.

A count clock f 58 has a frequency which is a double of that of the count clock f 8. The counter Z 51 is cleared by the edge detection signal 14, and counts up the count clock f 58 so as to output its count value to the comparator 34. The CR1 register 53 stores a CR1 setting value outputted from the arithmetic operation circuit 110, and outputs its stored value 20 to the comparators 24 and 34. The CR1 setting value is the result of the multiplication between the CRT stored value 101 and a constant number stored in the constant number register 112.

The comparator 24 compares the count value 9 with the CRT stored value 20, and generates a coincidence signal 21 when the count value 9 becomes coincident with the CRT stored value 20. The comparator 34 compares a count value 59 of the counter Z 51 with the CRT stored value 20, and generates a coincidence signal 31 when the count value 59 becomes coincident with the CRT stored value 20.

In response to the coincidence signal 21, the latch circuit 26 latches the level of the input signal 13 so as to output a lathed data 22. In response to the coincidence signal 31, the latch circuit 36 latches the level of the input signal 13 so as to output a lathed data 32.

In the other aspects, the shown embodiment is the same as the conventional example explained with reference to FIG. 1.

Now, operation of the first embodiment will be described. The discrimination on whether the input pulse includes the data A or the data B is performed by the same circuitry as that of the conventional example (the decoding of the single-pulse-modulated pulse), and therefore, explanation will be omitted. Therefore, only the discrimination on whether the input pulse includes the data I or the data II, will be described with reference to FIGS. 2 and 4.

In order to discriminate whether the input pulse includes the data I or the data H, it is sufficient if the level of the input signal can be detected during a period from 30% to 35% of one pulse period (called a "first period" hereinafter) and during a period from 60% to 65% of one pulse period (called a "second period" hereinafter). However, in order to reduce the number of multiplication operations, the present invention is configured to designate these two level detecting time points by one register.

Namely, the stored value 20 of the CR1 register 53 is compared with the count values of two counters, namely, the count values 9 and 59 of the counters 1 and Z 51. Here, the reason for setting the frequency of the count clock f' 58 at a double of that of the count clock f 8, is that a time position of the first period from 30% to 35% of one pulse period for a purse level detection is about one half of the time position of the first period from 60% to 65% of one pulse period for another pulse level detection.

The CR1 resister 53 is previously stored with the result obtained by multiplying the CRT stored value 101 (indicative of one pulse period) by the value of the constant register 112. This constant register 112 is previously set with 0.63 in order to perform the level detection at a time point of 63% of one pulse period (at an intermediate time point of the "second period").

In this case, the moment the count value 9 comes coincidence with the CR1 stored value 20 ($n_1 \times 0.63$), is a time point of 63% of the one pulse period. Accordingly, by performing the level detection at this coincidence point, it is possible to discriminate whether the input data is the data A-I or the date A-II. On the other hand, the count value 59 becomes coincident with the CR1 stored value 20 at a time point of 31.5% of the one pulse period, which is a half of the time point of 63% of the one pulse period. This time point of 31.5% is included in the "first period", and therefore, by performing the level detection at this coincidence point, it is possible to discriminate whether the input data is the data B-I or the date B-II.

Figure 5:
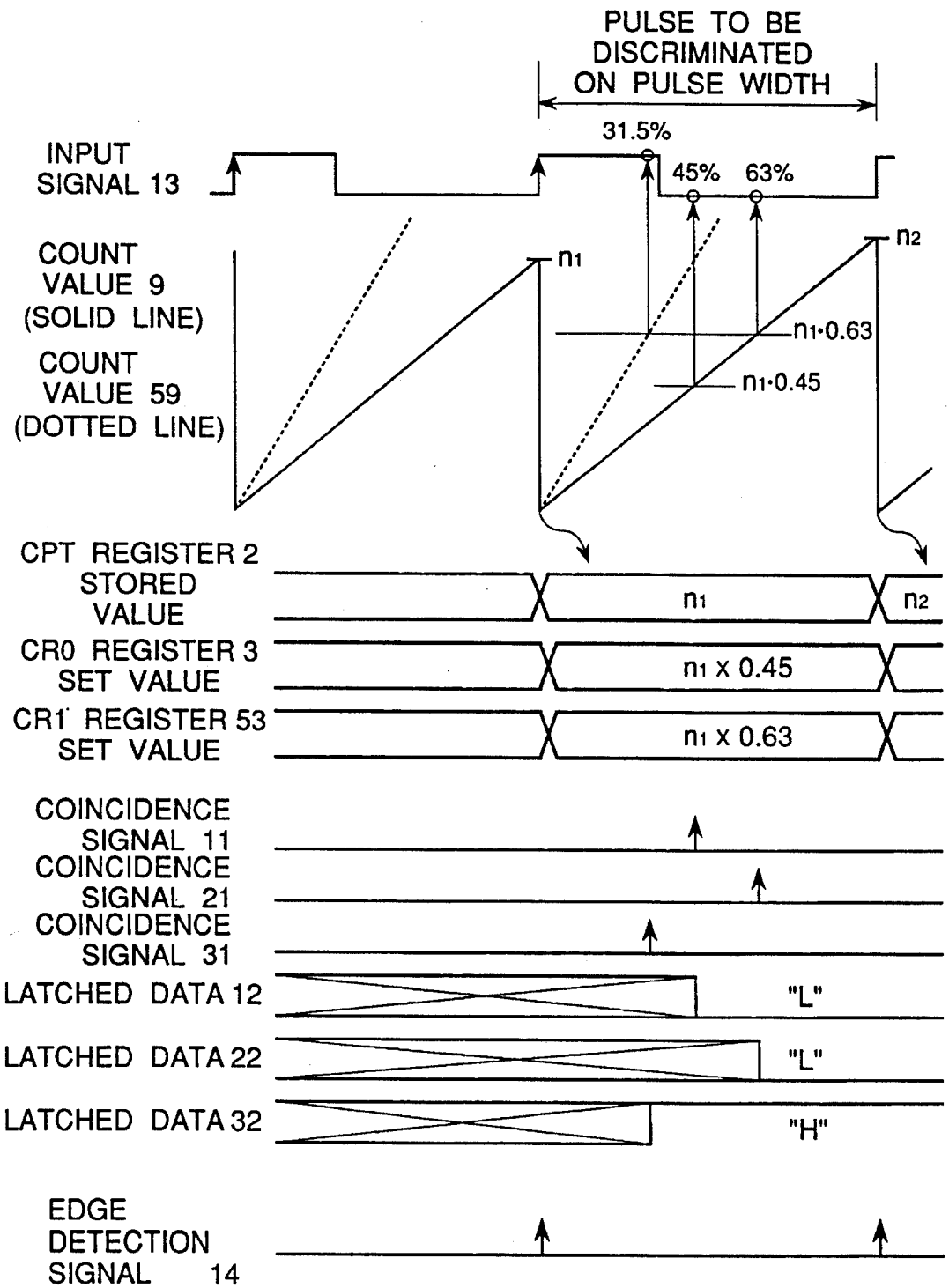
FIG. 5 is a timing chart illustrating an operation of the pulse width discriminating circuit shown in FIG. 4.

Under the above mentioned setting, the frequency of the count clock f' 58 is a double of that of the count clock f 8, the CRT stored value 20 becomes coincident with the count value 59 at a first place so that the comparator 34 outputs the coincidence signal 31, in response to which the latch circuit 36 latches the level of the input signal 13. Next, the CRT stored value 20 becomes coincident with the count value 9 so that the comparator 24 outputs the coincidence signal 21, in response to which the latch circuit 26 latches the level of the input signal 13. On the basis of the latched data 12, 22 and 32, the result of the discrimination is obtained. In the example shown in FIG. 5, since the hatched data 12, 22 and 32 are at a low level L, at a low level L, and at a high level H, respectively, it can be discriminated from the table of FIG. 6 that the input pulse is indicative of the data A and the data II.

As seen from the above, in the pulse width discriminating circuit in accordance with the present invention, the discrimination about whether the input pulse is the data A or the data B is performed by one setting of the CR0 register 3, and the discrimination about whether the input pulse is the data I or the data H is performed by one setting of the CR1 register 53. Therefore, it is not necessary to rewrite the CR0 register 3 and the CR1 register 53 during one pulse period. Accordingly, it is possible to perform the multiplication operation of the CPT stored value 101 with the value of the constant number registers 111 and 112 when the CPT stored value 101 is applied to the arithmetic operation circuit 110. Thus, it is no longer necessary to rewrite the content of the register during an interval from one detecting time point to a next detecting time point.

Therefore, even if the period of the input pulse becomes short, the rewriting of the CR1 register 53 no longer misses the level detecting time point, so that the discrimination about whether the input pulse is the data I or the dan II is performed without fail.

Furthermore, the number of the multiplication operations to be executed in the arithmetic operation circuit 110 can be reduced to two. In other words, the lead on the arithmetic operation circuit 110 can be reduced.

In the above mentioned example, the data A has the duty ratio of 30% and the data B has the duty ratio of 60%. However, the present invention is not limited to only this example, but can be applied to other various examples. If the data A has the duty ratio of 35% and the data B has the duty ratio of 70%, it is sufficient if a ratio in frequency of the count clock f 8 to the count clock f' 58 is set to 3:7.

If the arithmetic circuit 110 includes only one constant number register, the constant number is stored with 0.45 for the first place and the multiplication or 0.45 with the, CPT stored value 101 is executed so that the result of the multiplication is stored in the CR0 register 3, and thereafter, the constant number is rewritten to 0.63, so that the multiplication of 0.63 with the CPT stored value 101 is executed similarly and the result of the multiplication is stored in the CR1 register 53. In this case, a similar effect can be obtained.

Now, explanation will be made on a second embodiment which is constructed to decode the double-pulse-modulated signal by setting a level detecting time point designating register only one time.

Figure 7:
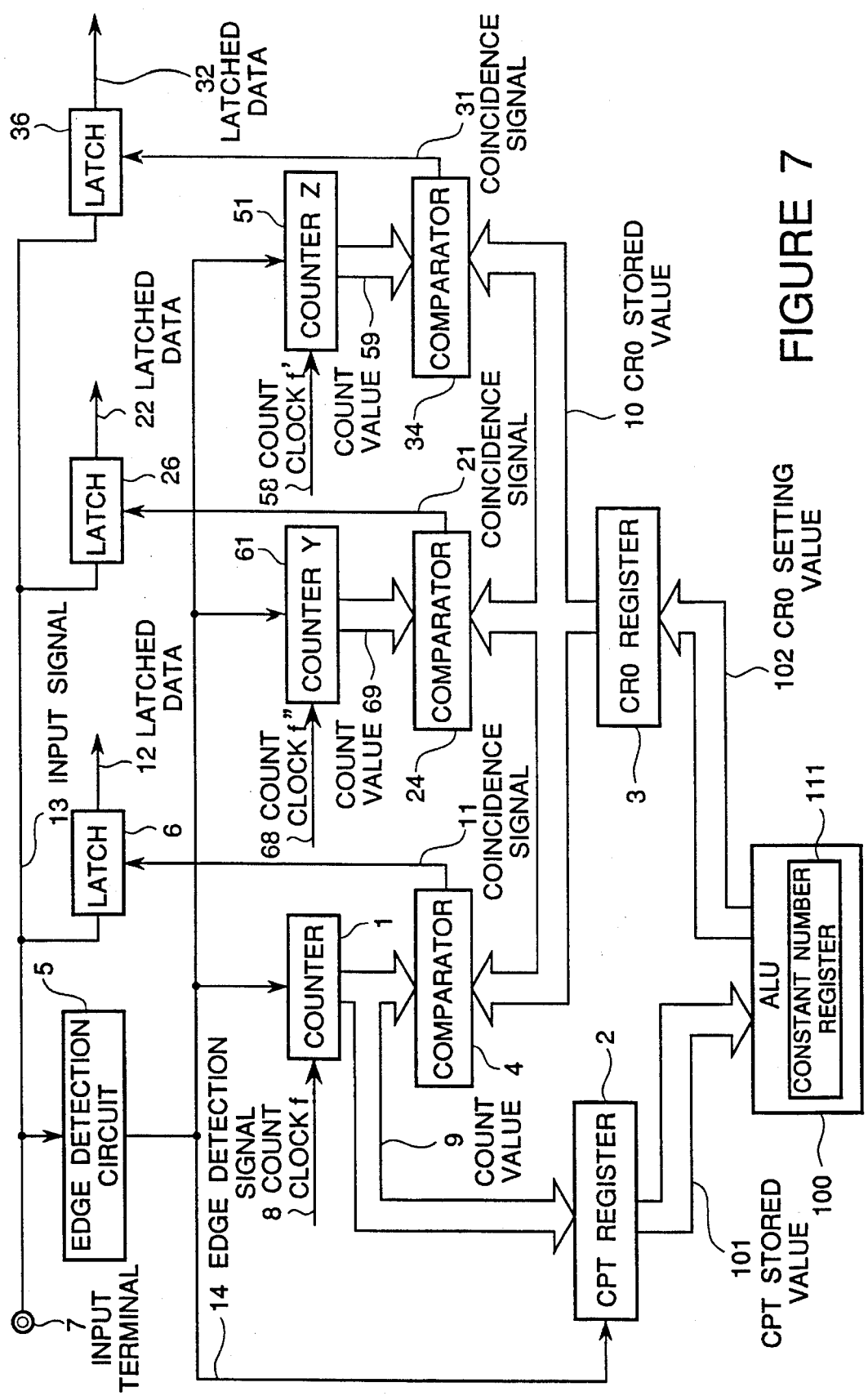
FIG. 7 is a block diagram of a second embodiment of the pulse width discriminating circuit in accordance with the present invention.
Figure 8:
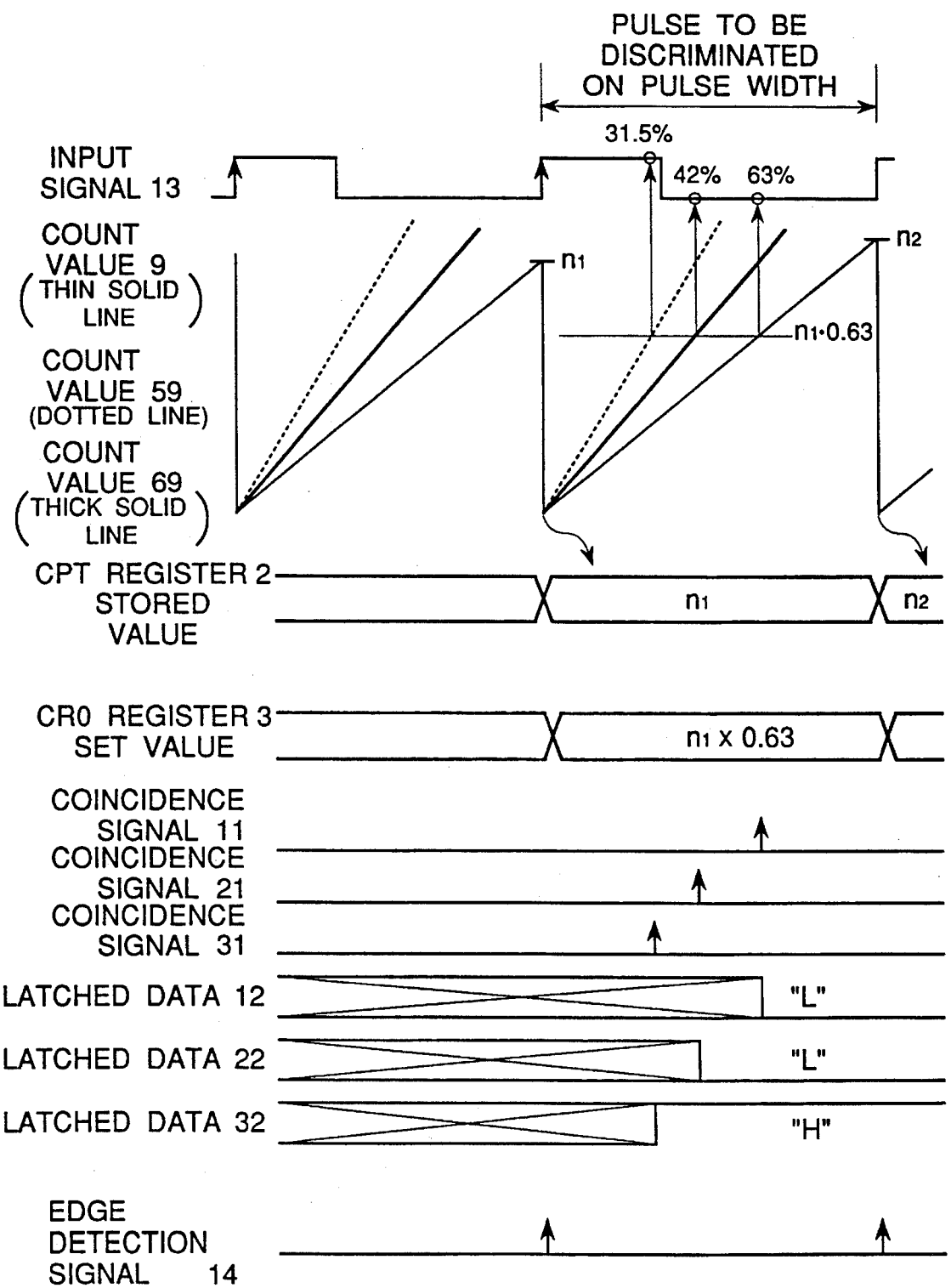
FIG. 8 is a timing chart illustrating an operation of the pulse width discriminating circuit shown in FIG. 7.

Referring to FIG. 7, there is shown a block diagram of a second embodiment of the pulse width discriminating circuit in accordance with the present invention. In FIG. 7, elements similar to those shown in FIG. 1 are given the same Reference Numerals, and explanation thereof will be omitted.

As seen from comparison between FIGS 1 and 7, the second embodiment is characterized in that in addition to the construction shown in FIG. 1, there are provided a counter Z 51, a counter Y 61, comparators 24 and 34 and latch circuits 26 and 36.

The counter Z 51 is cleared by the edge detection signal 14, and counts up a count clock f' 58 so as to output its count value to the comparator 34. The counter Y 61 is cleared by the edge detection signal 14, and counts up a count clock F" 68 so as to output its count value to the comparator 24. 1S The comparator 24 compares a count value 69 of the counter Y 61 with the CR0 stored value 10, and generates a coincidence signal 21 when the count value 69 becomes coincident with the CR0 stored value 10. The comparator 34 compares a count value 59 of the counter Z 51 with the CR0 stored value 10, and generates a coincidence signal 31 when the count value 59 becomes coincident with the CR0 stored value 10.

In response to the Coincidence signal 21, the latch circuit 26 latches the level of the input signal 13 so as to output a lathed data 22. In response to the coincidence signal 31, the latch circuit 36 latches the level of the input signal 13 so as to output a lathed data 32.

The count clock f' 58 has a frequency which is a double of that of the count clock f 8, and the count clock f" 68 has a frequency which is one and half times of that of the count clock f 8. 0.63 is set into the constant number register 11 I.

In the other aspects, the shown embodiment is the same as the conventional example explained with reference to FIG. 1.

Now, operation will be explained. The operation from the moment the rising edge of the input signal is detected by the edge detection circuit 5 until the moment the count value 9 is stored in the CPT register 2 in response to the edge detection signal 14, is the same as the corresponding operation of the conventional example.

The arithmetic operation circuit 100 executes a multiplication of the CPT stored value 101 with the value of the constant number register 111, and the result of the multiplication is set into the CR0 register 3 as the CR0 setting value 102. In this embodiment, the three level detecting time points can be designated by setting the CR0 register only one time for each one pulse period.

Similarly to the first embodiment, the frequency of the count clock f' 58 is a double of that of the count clock f 8, and the value of the CR0 register 3 is so set that the comparator 34 outputs the coincidence signal 31 at the time point of 31.5% of one pulse period, and the comparator 4 outputs the coincidence signal 11 at the time point of 62% of one pulse period. Accordingly, since the frequency of the count clock f"68 is one and half times of that of the count clock f 8, the comparator 24 outputs the coincidence signal 21 at the time point of 42% of one pulse period. Therefore, the latch circuits 6.26 and 36 latch the level of the input signal 13 at the time points of 31.5%, 42% and 63% of one pulse period, respectively. Thus, the pulse width of the input pulse is discriminated.

As seen from the above, the second embodiment is characterized in that the value of the level detecting time point designating register is compared with a count value of a plurality of counters, respectively, and on the other hand, the frequency of the count clocks supplied to the respective counters is set so as to ensure that the coincidence between the register and the respective counters becomes in time with respective love detecting time points. With this arrangement, the pulse width discrimination can be performed without rewriting the register, by setting the level detecting time point designating register only one time for one pulse period.

Therefore, even if the period of the input pulse becomes short, the rewriting of the CR0 register 3 no longer misses the level detecting time point, so that the discrimination about whether the input pulse is the data A-I, A-II, B-I or B-II is performed without fail.

In addition, the number of the multiplication operations to be executed by the arithmetic operation circuit 100 can be reduced to only one for each one pulse period, and therefore the load on the arithmetic operation circuit 100 become extremely small.

Figure 9:
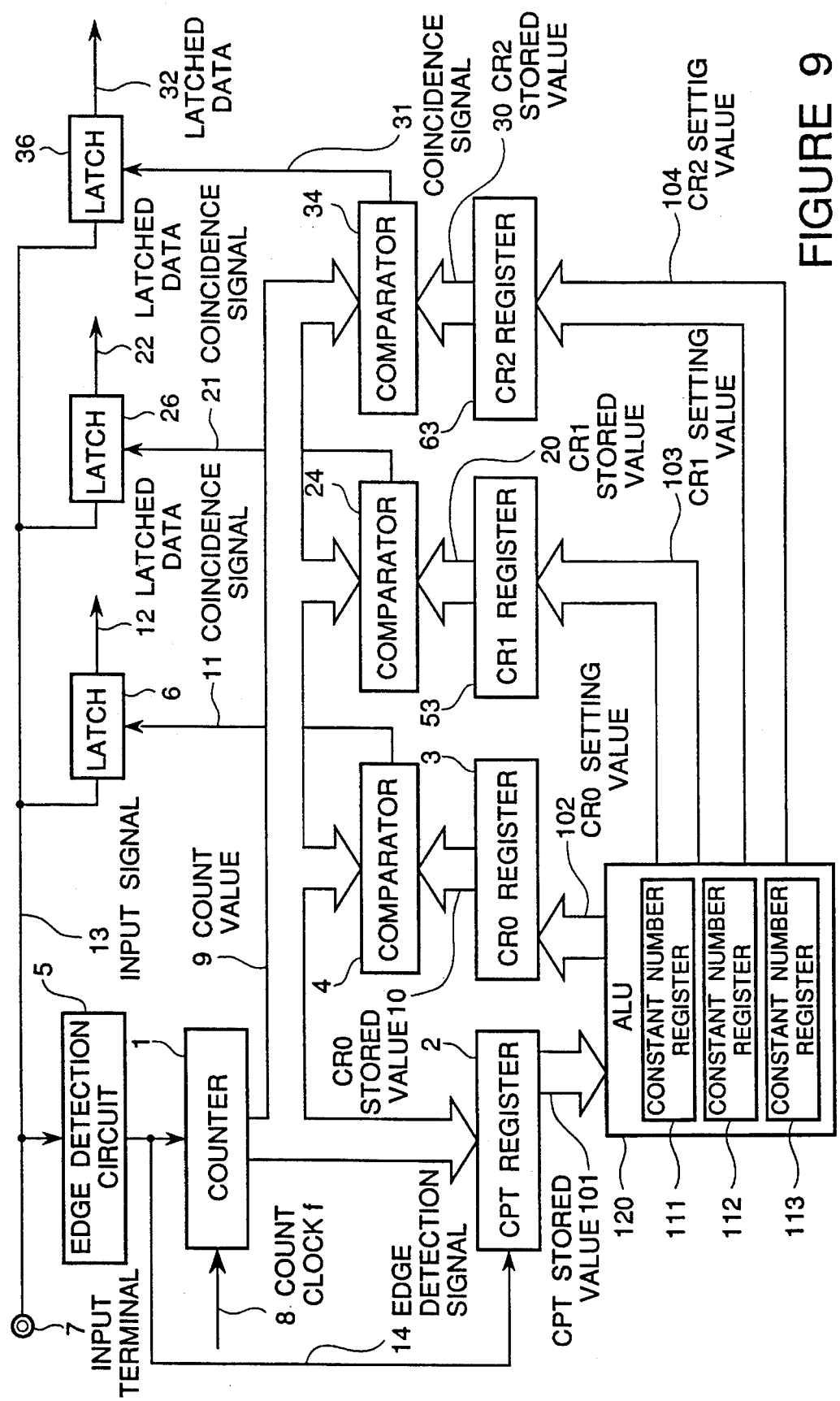
FIG. 9 is a block diagram of a third embodiment of the pulse width discriminating circuit in accordance with the present invention.

Referring to FIG. 9, there is shown a block diagram of a third embodiment of the pulse width discriminating circuit in accordance with the present invention. In FIG. 9, elements similar to those shown in FIG. 1 are given the same Reference Numerals, and explanation thereof will be omitted.

As seen from comparison between FIGS. 1 and 9, the third embodiment is characterized in that in addition to the construction shown in FIG. 1, there are provided comparators 24 and 34, latch circuits 26 and 36, a CR1 register 53, a compare register 63 (called a "CR2 register" hereinafter), and an arithmetic operation circuit 120 constituted by adding two constant number registers 112 and 113 to the constant number register 111 of the arithmetic operation circuit 100.

The comparator 24 compares the count value 9 of the counter 1 with a CRl stored value 20 in the CR1 register 53, and generates a coincidence signal 21 when the count value 9 becomes coincident with the CR1 stored value 20. The comparator 34 compares a count value 9 of the counter 1 with a CR2 stored value 30 in the CR2 register 63, and generates a coincidence signal 31 when the count value 9 becomes coincident with the CR2 stored value 30.

In response to the coincidence signal 21, the latch circuit 26 latches the level of the input signal 13 so as to output a lathed data 22. In response to the coincidence signal 31, the latch circuit 36 latches the level of the input signal 13 so as to output a lathed data 32.

The CR1 register 53 is configured to store a CR1 setting value 103 outputted from the arithmetic operation circuit 120 and to output its stored value as the CR1 stored value 20 the comparator 24. The CR2 register 63 is configured to store a CR2 setting value 104 outputted from the arithmetic operation circuit 120 and to output its stored value as the CR0 stored value 30 the comparator 34.

In the other aspects, the shown embodiment is the same as the conventional example explained with reference to FIG. 1.

Now, operation will be explained. The operation from the moment the rising edge of the input signal is detected by the edge detection circuit 5 until the moment the count value 9 is stored in the CPT register 2 in response to the edge detection signal 14, is the same as the corresponding operation of the conventional example.

The arithmetic operation circuit 120 executes the multiplication operation of the CPT stored value 101 with each of the value of the constant number registers 111, 112 and 113 and stores respective results of multiplication to the CR0 register 3, the CR1 register 53 and the CR2 register 63 as the CR0 setting value 102, the CR1 setting value 103 and the CR2 setting value 104, respectively. Namely, in this third embodiment, three multiplication operations are continuously executed, and the result of the three multiplication operations are stored in the corresponding registers. Here, the constant number registers 111, 112 and 113 are set with 0.32, 0.45 and 0.63, respectively. Accordingly, coincidence between the count value 9 and the CR0 stored value 10 occurs at a time point of 32% of one pulse period, and coincidence between the count value 9 and the CR1 stored value 20 occurs at a time point of 45% of one pulse period. In addition, coincidence between the count value 9 and the CR2 stored value 20 occurs at a time point of 63% of one pulse period. Therefore, the level of the input signal 13 is latched in the latch circuits 6, 26 and 36 at the time points of 32%, 45% and 63%, respectively, and the input pulse width discrimination is performed on the basis of the data latched in these latch circuits 6, 26 and 36.

In the third embodiment, since the three registers are provided for storing the result of the multiplication operations made in time arithmetic operation circuit 120, the multiplication operations must be performed in the arithmetic operation circuit 120 three times, similarly to the conventional example. However, a plurality of count clocks which are required in the first and second embodiments are no longer necessary, but similarly to the first and second embodiments, the arithmetic operation corresponding to the time points of 32%, 45% and 63% of one pulse period can be performed with only one count clock at the time the CPT stored value 101 is applied to the arithmetic operation circuit 120. It is not necessary to rewrite the content of the registers during a period from one level detecting time point to a next level detecting time point.

The invention has thus been shown and described with reference to the specific embodiments. However, it should be noted that the present invention is in no way limited to the details of the illustrated structures but changes and modifications may be made within the scope of the appended claims.

I claim:

1. A pulse width discriminating circuit comprising an edge detecting circuit receiving an input signal for generating a detection signal when said input signal changes from a first level to a second level, a plurality of counters each cleared by said detection signal and counting a different count clock, a capture register responding to said detection signal to store a count value of one counter of said plurality of counters, an arithmetic operation circuit for executing a predetermined arithmetic operation on the stored value in said capture register, a compare register storing the result of said predetermined arithmetic operation performed in said arithmetic operation circuit, a plurality of comparators each comparing the stored value of said compare register with a count value of a corresponding one counter of said plurality of counters for generating a coincidence signal, a plurality of latch circuits each responding to said coincidence signal of a corresponding comparator of said plurality of comparators to latch a level of said input signal.

2. A pulse width discriminating circuit claimed in claim 1 wherein a plurality of compare registers are provided, and said arithmetic operation circuit executes a plurality of different arithmetic operations on the stored value in said capture register, so that the result of said plurality of different arithmetic operations performed in said arithmetic operation circuit are stored in said plurality of compare registers, respectively, and wherein each of said plurality of comparators compares the stored value of a corresponding one compare register of said plurality of compare registers with a count value of a corresponding one counter of said plurality of counters for generating a coincidence signal.

3. A pulse width discriminating circuit claimed in claim 2 wherein said plurality of counters includes a first counter for counting a first count clock and a second counter for counting a second count clock, wherein said plurality of compare registers includes a first compare register for storing a first arithmetic operation result of said arithmetic operation circuit and a second compare register for storing a second arithmetic operation result of said arithmetic operation circuit, and wherein said plurality of comparators includes a first comparator for comparing the count value of said first counter and the stored value of said first compare register, a second comparator for comparing the count value of said second counter and the stored value of said second compare register, and a third comparator for comparing the count value of said first counter and the stored value of said second compare register.

4. A pulse width discriminating circuit comprising an edge detecting circuit receiving an input signal for generating a detection signal when said input signal changes from a first level to a second level, a counter cleared by said detection signal and counting a count clock, a capture register responding to said detection signal to store a count value of said counter, an arithmetic operation circuit for executing a plurality of predetermined arithmetic operations on the stored value in said capture register, a plurality of compare registers each storing the result of a corresponding one of said predetermined arithmetic operations performed in said arithmetic operation circuit, a plurality of comparators each comparing the stored value of a corresponding one compare register of said plurality of compare registers with the count value of said counter for generating a coincidence signal, a plurality of latch circuits each responding to said coincidence signal of a corresponding comparator of said plurality of comparators to latch a level of said input signal.

* * * * *

UNITED STATES PATENT AND TRADEMARK OFFICE
CERTIFICATE OF CORRECTION

PATENT NO. : 5,479,118
DATED : December 26, 1995
INVENTOR(S) : Shinji NIIJIMA

It is certified that error appears in the above-indentified patent and that said Letters Patent is hereby corrected as shown below:

Title page, item [51], please insert section --"[30] Foreign Application Priority Data  Dec. 10, 1993  Japan 5-310527--.

Signed and Sealed this

Eighteenth Day of June, 1996

*Attest:*

BRUCE LEHMAN

*Attesting Officer*     *Commissioner of Patents and Trademarks*